United States Patent
Sinclair et al.

(10) Patent No.: US 10,692,697 B2
(45) Date of Patent: *Jun. 23, 2020

(54) APPARATUS AND TECHNIQUES FOR DECELERATED ION BEAM WITH NO ENERGY CONTAMINATION

(71) Applicant: Varian Semiconductor Equipment Associates, Inc., Gloucester, MA (US)

(72) Inventors: Frank Sinclair, Boston, MA (US); Daniel Tieger, Manchester, MA (US); Klaus Becker, Kensington, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/155,469

(22) Filed: Oct. 9, 2018

(65) Prior Publication Data
US 2019/0051493 A1    Feb. 14, 2019

Related U.S. Application Data

(63) Continuation of application No. 15/463,473, filed on Mar. 20, 2017, now Pat. No. 10,147,584.

(51) Int. Cl.
*H01J 37/20* (2006.01)
*H01J 37/317* (2006.01)
*H01J 37/04* (2006.01)

(52) U.S. Cl.
CPC .......... *H01J 37/3171* (2013.01); *H01J 37/04* (2013.01); *H01J 2237/0042* (2013.01); *H01J 2237/022* (2013.01); *H01J 2237/04756* (2013.01)

(58) Field of Classification Search
USPC ..................................................... 250/492.21
See application file for complete search history.

(56) References Cited

U.S. PATENT DOCUMENTS

| | | |
|---|---|---|
| 7,579,602 B2 | 8/2009 | Benveniste et al. |
| 7,619,228 B2 * | 11/2009 | Benveniste ............ H01J 37/05 250/396 R |
| 7,692,139 B2 | 4/2010 | Koo et al. |
| 8,003,956 B2 | 8/2011 | Lischer et al. |
| 8,101,488 B1 * | 1/2012 | Smick ................ H01J 37/3171 250/423 R |
| 8,202,792 B2 | 6/2012 | Papasouliotis et al. |
| 8,222,128 B2 | 7/2012 | Sasaki et al. |
| 8,252,115 B2 | 8/2012 | Barker et al. |
| 8,293,620 B2 * | 10/2012 | Signamarcheix .......................... H01L 21/76254 257/E21.568 |
| 9,385,219 B2 | 7/2016 | Yieh et al. |
| 9,515,166 B2 | 12/2016 | Nemani et al. |
| 9,754,791 B2 | 9/2017 | Godet et al. |
| 2008/0078949 A1 | 4/2008 | Benveniste |
| 2008/0135777 A1 | 6/2008 | Yamashita et al. |
| 2008/0149845 A1 | 6/2008 | Benveniste et al. |

(Continued)

*Primary Examiner* — Phillip A Johnston

(57) ABSTRACT

An ion implantation system may include an ion source to generate an ion beam, a substrate stage disposed downstream of the ion source; and a deceleration stage including a component to deflect the ion beam, where the deceleration stage is disposed between the ion source and substrate stage. The ion implantation system may further include a hydrogen source to provide hydrogen gas to the deceleration stage, wherein energetic neutrals generated from the ion beam are not scattered to the substrate stage.

16 Claims, 3 Drawing Sheets

(56) References Cited

U.S. PATENT DOCUMENTS

| | | |
|---|---|---|
| 2008/0230724 A1 | 9/2008 | Low |
| 2009/0095894 A1 | 4/2009 | Koo et al. |
| 2009/0252887 A1 | 10/2009 | Barker et al. |
| 2010/0084582 A1* | 4/2010 | Lischer ................ H01J 37/026 250/492.21 |
| 2011/0143527 A1 | 6/2011 | Platow et al. |
| 2012/0083136 A1 | 4/2012 | Godet et al. |
| 2015/0099350 A1 | 4/2015 | Srinivasan |
| 2015/0294863 A1 | 10/2015 | Nemani et al. |
| 2015/0380526 A1 | 12/2015 | Godet et al. |
| 2016/0005839 A1 | 1/2016 | Yieh et al. |
| 2016/0233100 A1 | 8/2016 | Godet et al. |

* cited by examiner

APPARATUS AND TECHNIQUES FOR DECELERATED ION BEAM WITH NO ENERGY CONTAMINATION

This application is a divisional of, and claims the benefit of priority to, U.S. patent application Ser. No. 15/463,473, filed Mar. 20, 2017, entitled "Apparatus and Techniques for Decelerated Ion Beam with No Energy Contamination," which application is incorporated herein by reference in its entirety.

FIELD

The present embodiments relate to beamline ion implanters and more particularly to electrodes in ion implanters for accelerating an ion beam.

BACKGROUND

In the present day, beamline ion implanters employ multiple components to direct an ion beam from an ion source to a substrate. In order to properly treat a substrate, the ion beam may be accelerated or decelerated to a target ion energy, and may have the trajectory and shape of the ion beam manipulated by various beamline components to produce a set of target characteristics of the ion beam at the substrate. In many types of ion implanters, including medium energy and low energy ion implanters, an ion source may generate an ion beam that is guided down a beamline at a relatively high energy, while decelerated to a final energy just before impacting a substrate. This procedure is used because a best way to produce high current beams (having current more than≈1 mA) at low energy (under≈10 keV) is to transport an ion beam at a relatively higher energy through ion extraction, mass analysis and other beamline elements, before deceleration takes place to a final energy at the latest possible stage before striking the substrate. Such low energy high current beams will not transport for long distances in a beamline because of space charge forces that cause the ions to repel one another. In known ion implanters, the architecture with deceleration near the wafer introduces a risk of energy contamination from energetic species that strike the substrate. In particular, ions that are neutralized in the volume just before or during a final deceleration will continue to propagate with no change in energy, and may accordingly strike the wafer (substrate) at a higher energy than intended.

In some ion implanters, this problem is addressed by providing a bend within a component such as a deceleration stage so that neutrals traveling through the deceleration stage may be screened from the substrate by virtue of the bend in the deceleration stage. While neutrals traveling in a straight direction may fail to reach the substrate, energy contamination is found even in ion implanters having a bend in a deceleration stage.

With respect to these and other considerations the present disclosure is provided.

BRIEF SUMMARY

In one embodiment, an ion implantation system may include an ion source to generate an ion beam; a substrate stage disposed downstream of the ion source, and a deceleration stage including a component to deflect the ion beam, where the deceleration stage is disposed between the ion source and substrate stage. The ion implantation system may also include a hydrogen source to provide hydrogen gas to the deceleration stage, wherein energetic neutrals generated from the ion beam are not scattered to the substrate stage.

In another embodiment, a method of ion implantation may include generating an ion beam; decelerating the ion beam in a deceleration stage, altering a trajectory of the ion beam during the decelerating, and directing hydrogen gas into the deceleration stage during the decelerating.

In a further embodiment, a deceleration stage to treat an ion beam may include a housing to contain the ion beam, and a deceleration assembly to decelerate the ion beam, where the deceleration assembly is disposed upstream of a substrate stage, and includes a first plurality of electrodes disposed within the housing. The deceleration stage may also include a deflection assembly to deflect the ion beam, where the deflection assembly includes a second plurality of electrodes disposed within the housing, wherein a trajectory of the ion beam is altered. The deceleration stage may further include a hydrogen source to provide hydrogen gas inside the housing, wherein a partial pressure of hydrogen inside the housing is greater than $10^{-6}$ Torr.

Figure 1:
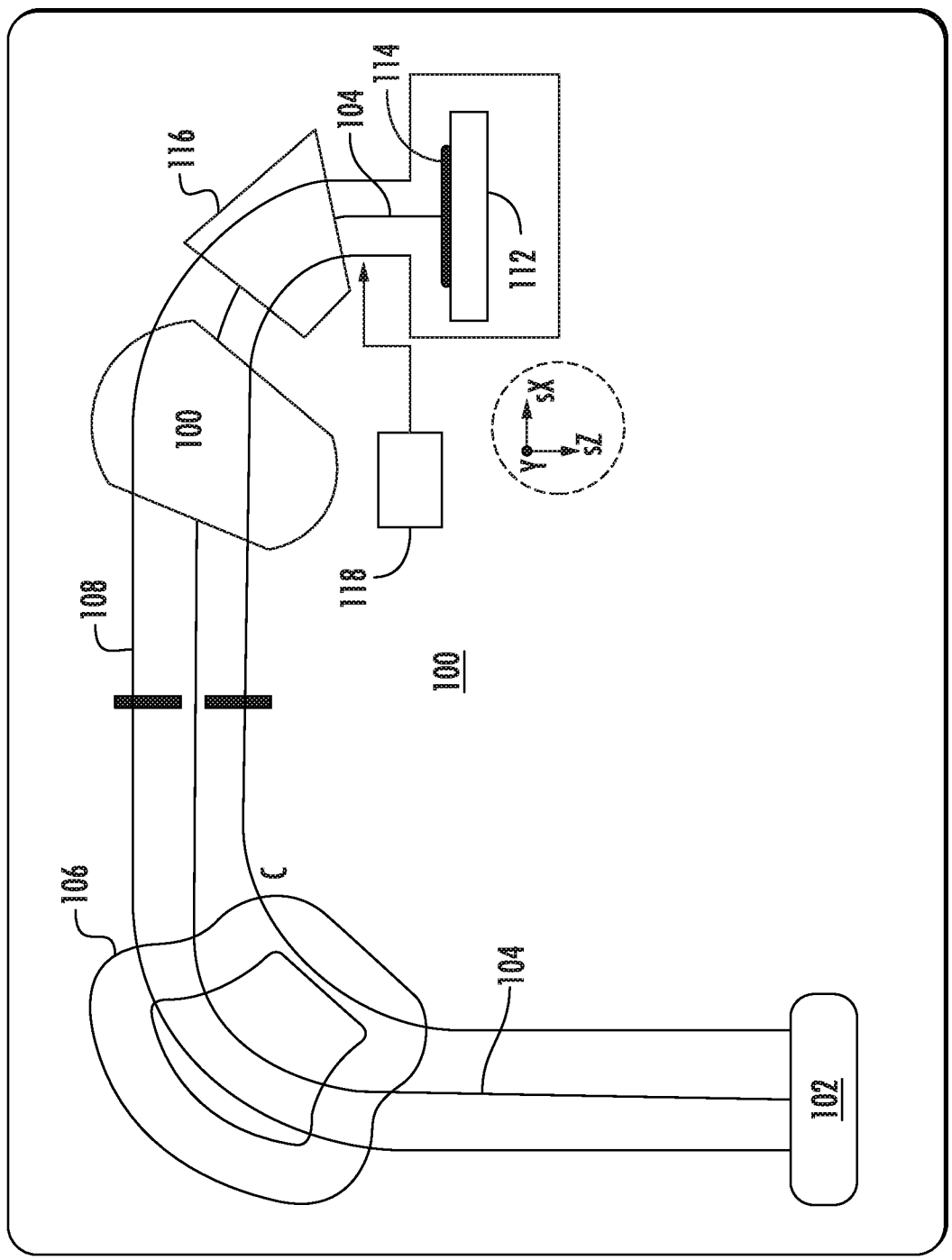
FIG. 1 depicts a block diagram of an ion implanter 100 according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments are related to ion beam processing apparatus such as beamline implanters. Various embodiments may be useful in beamline ion implanters where ion energy may range up to approximately 500 keV, and in particular embodiments ion energy may be below 50 keV. The embodiments are not limited in this context. As detailed below, the present embodiments facilitate operation of ion implanters at relatively lower energy, such as below 50 keV, while preventing energy contamination associated with conventional ion implanters.

FIG. 1 depicts a block diagram of an ion implanter 100 according to embodiments of the present disclosure. The ion implanter 100 includes an ion source 102, used to generate an ion beam 104, an analyzer magnet 106, vacuum chamber 108, a collimator 110, and substrate stage 112, shown supporting a substrate 114. The ion implanter 100 further includes a deceleration stage 116, disposed downstream of the collimator 110. For simplicity, the ion beam 104 is depicted merely as a central ray trajectory of the ion beam. In various embodiments, the ion source 102 may be an indirectly heated cathode (IHC) ion source, an RF ion source, a microwave ion source or other ion source. The analyzer magnet 106 may alter the trajectory of ions extracted from the ion source 102 as in conventional analyzer magnets. The vacuum chamber 108 may include a mass resolving slit, which slit may function as a conventional mass resolving slit to screen out ions of undesired mass. In various embodiments, the ion beam 104 may be provided as a static ribbon beam, a spot beam, or a scanned spot beam, where the scanned spot beam is generated by an electrostatic scanner or a magnetic scanner, and may include multiple components or stages. The collimator 110 may be a magnetic collimator or an electrostatic collimator to function at least to generate a collimated ion beam to be conducted to the substrate 114. The ion implanter 100 may include other beamline components including apertures, dithering components, additional acceleration/deceleration components, where the operation of these other components is well known. For clarity, further discussion of such components is omitted herein.

As further shown in FIG. 1, the ion implanter 100 may include a hydrogen source 118, where the hydrogen source 118 is arranged to provide hydrogen gas to the deceleration stage 116. As discussed below, in conjunction with the deceleration stage 116, the hydrogen source 118 may aid in reducing energy contamination for species implanted into the substrate 114. In particular embodiments, the hydrogen source 118 may provide hydrogen gas directly into the deceleration stage 116, where the hydrogen gas aids in beam transport of the ion beam 104 while reducing or eliminating energy contamination.

Figure 2:
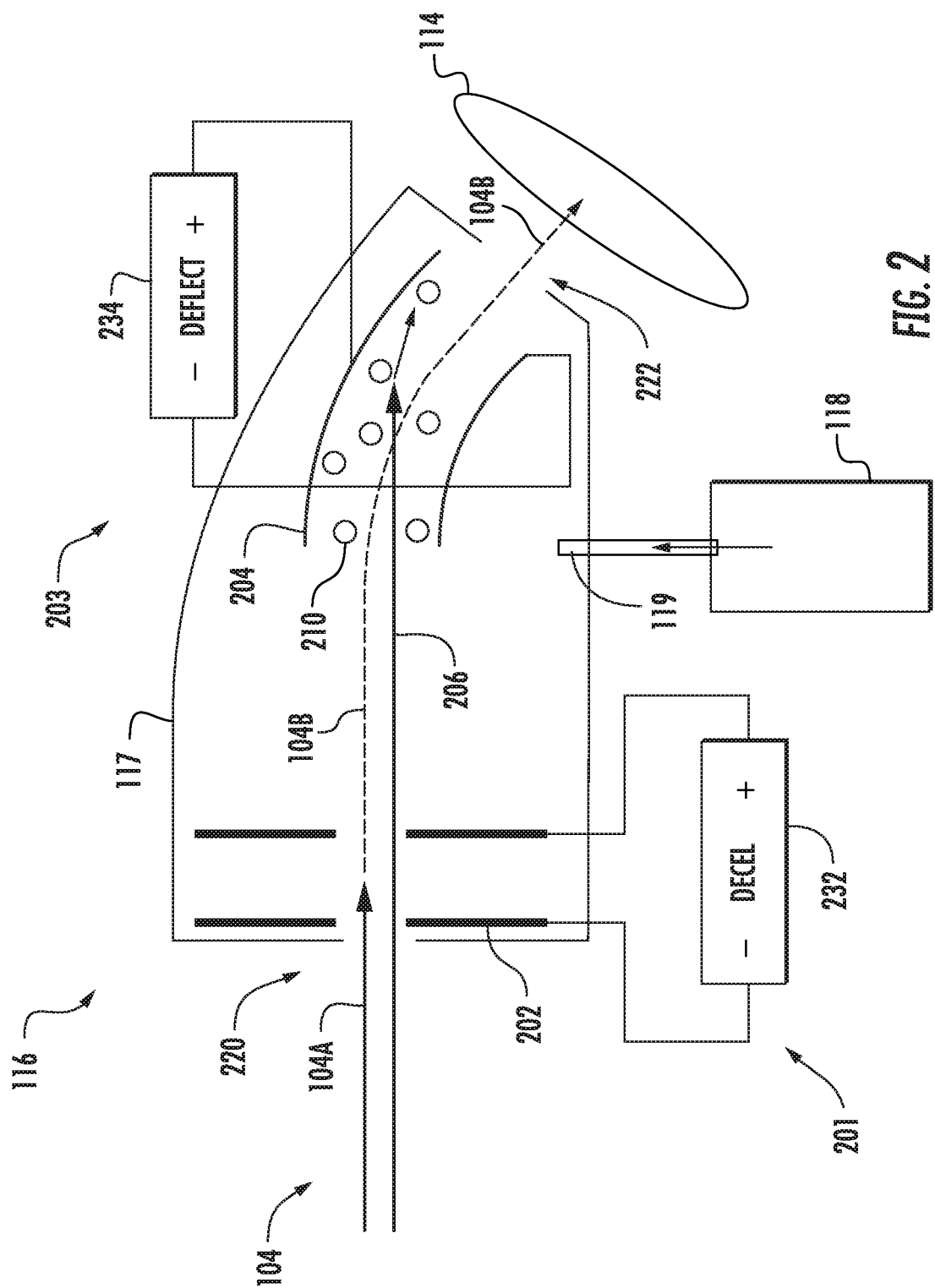
FIG. 2 shows a detailed view of an embodiment of a deceleration stage 116 according to embodiments of the disclosure.

Turning now to FIG. 2, there is shown a detailed view of an embodiment of the deceleration stage 116. The deceleration stage 116 may include a deceleration assembly 201, including a deceleration power supply 232 and deceleration electrodes 202 that are used to alter the energy of the ion beam 104, and in particular to decrease the energy of the ion beam 104 from a higher energy ion beam 104A (e.g., 10 keV) to a lower energy ion beam 104B (e.g., 2 keV). The deceleration stage 116 may further include a deflection assembly 203, including a deflection power supply 234 and deflection electrodes 204, to deflect the path of the ion beam 104, so that the direction of propagation of the ion beam 104 changes as the ion beam 104 exits the deceleration stage 116 and impacts the substrate 114. While shown as separate components, in various embodiments, the deflection assembly 203 and the deceleration assembly 201 may share common electrodes that act to change direction and energy of the ion beam 104.

As further depicted in FIG. 2, the deceleration stage 116 may act to screen potential contaminants from impacting the substrate 114. As depicted, the deceleration stage 116 has a curved shape, wherein the deceleration stage does not provide a line of sight path for the ion beam 104 from an entrance 220 to an exit 222 of the deceleration stage 116. Because the ion beam 104 is made of charged particles, the ion beam 104 may be deflected via electric fields generated by the deflection assembly 203.

Notably, any neutrals, such as energetic neutrals 206, entering the deceleration stage 116, may potentially present a source of energetic contamination at the substrate 114. This potential for contamination is because the energetic neutrals, carrying no net charge, are not decelerated by the deceleration assembly 201, and accordingly may travel through the deceleration stage 116 at a higher energy than is imparted to the lower energy ion beam 104B. Thus, any energetic neutrals that exit the deceleration stage 116 may have higher energy than the target energy for implantation, where the target energy is imparted to ions that are decelerated by the deceleration stage 116, and corresponds to the energy of the lower energy ion beam 104B. For example, the target energy for ion implantation, carried by lower energy ion beam 104B, may be 2 keV, while the energetic neutrals 206 may carry an energy of 10 keV entering the deceleration stage 116. By providing a curved shape, the deflection assembly 203 may capture the energetic neutrals, since the trajectory of the energetic neutrals 206 is not altered by fields generated by the deflection assembly 203, allowing the energetic neutrals 206 to travel in a straight line trajectory toward walls of the deflection assembly 203.

To provide proper beam control of the ion beam 104, background gas may be provided to an ion implanter, including to the deceleration stage 116. The background gas may be provided by the hydrogen source 118, and may be flowed into a housing 117 of the deceleration stage 116, so as to establish an appropriate partial pressure of hydrogen gas 210 in the deceleration stage 116. After flowing the hydrogen gas 210 into the deceleration stage 116, the hydrogen gas 210 may be ionized by electronic interactions with the ions in ion beam 104. The ionization of hydrogen gas 210 (to generate positive ions) may thus release electrons that are trapped in the ion beam 104, reducing the space charge potential, and improving ion beam properties, such as maintaining a compact ion beam, by reducing mutual repulsion among positive ions. This reduction is space charge potential is especially advantageous for low energy ions having energies below 50 keV, for example. The background gas ions, after being ionized, have low energy, such as a few eV or less, are repelled by the beam potential and may be attracted to the walls of components of the beamline, such as the housing 117. In this manner, a background gas may improve beam optics for a low energy ion beam while not interfering with an implantation process.

Advantageously, the provision of hydrogen gas 210 to the deceleration stage 116 at the appropriate partial pressure may provide proper beam control by reducing space charge, while also reducing energy contamination in comparison to known ion implanters. In known ion implanters using nitrogen gas or inert gas such as argon or xenon, energy contamination has been observed in substrates implanted with dopant ions such as boron. In particular, high energy tails of depth distribution of dopant may be observed within an implanted substrate, indicating the effect of energetic neutrals that are not properly decelerated and manage to traverse a deceleration stage. This contamination is the case even for ion implanters having curved deceleration stages where neutrals traveling in straight line trajectories entering the deceleration stage may be intercepted by the walls of the deceleration stage.

Without limitation as to a particular theory, the energy contamination observed in known ion implanters may arise at least in part from Rutherford scattering of energetic neutrals from the background gas present in an ion implanter. In particular, the interaction between a projectile ion (or energetic neutral) and a residual gas atom can be analyzed using the model of Rutherford scattering. The geometry of scattering of ions in an ion beam from interactions with a background gas atom are summarized in Table I. As shown in Table I. when a conventional background gas such as nitrogen is used in an ion implanter, dopant ions may be scattered through a relatively large scattering angle. In the case of $B^+$ ions, the boron ions may be scattered up to 180 degrees by nitrogen background gas, providing an explanation as to why energetic neutrals may emerge from a deceleration stage, even if the deceleration stage is configured in a curved fashion as in FIG. 2. Said differently, energetic neutrals entering the deceleration stage 116 may be reflected by background gas species in a manner that redirects the energetic neutrals out of the deceleration stage 116 and towards the substrate 114. This circumstance especially applies when nitrogen gas or a higher mass gas is used, where the deflection angle for ions may be quite large, especially for $P^+$ or $B^+$ ions. When using nitrogen (m=14 amu) as a background gas as in known ion implanters, a boron ion (or energetic neutral) can be scattered by any angle up to 180°. Such a scattering event will result in a transfer of some kinetic energy from the boron ion (or energetic neutral) to the nitrogen atom, but even at a scattering angle θ of 30° the scattered boron atom will still have 80% of the initial energy before scattering. Assuming that the trajectory of the 30-degree-scattered energetic neutral allows the energetic neutral to emerge from the deceleration stage, and assuming that 80% energy of the scattered energetic neutral does not match the intended energy of the implanting ions, such a scattering event will contribute to energy contamination if the scattered neutral reaches the wafer.

Notably, in the present embodiments where hydrogen source 118 is used to direct hydrogen to the deceleration stage 116, the maximum scattering angle for $B^+$ species encountering hydrogen is just 5 degrees, meaning that an energetic B neutral, having essentially the same mass as $B^+$, will be deflected in a similar manner. Accordingly, an energetic B neutral will not have a trajectory substantially changed when colliding with a hydrogen gas species, reducing the probability that the reflected energetic B neutral emerges from a curved deceleration stage where the curvature may be 30 degrees or more.

TABLE I

| | Maximum Scattering Angles (deg) | | | |
|---|---|---|---|---|
| Ion | $^{11}B+$ | $^{31}P+$ | $^{49}BF_2+$ | $^{75}As+$ |
| Hydrogen | 5.2 | 1.8 | 1.2 | 0.8 |
| Nitrogen | 180 | 26.8 | 16.6 | 10.8 |

Figure 3:
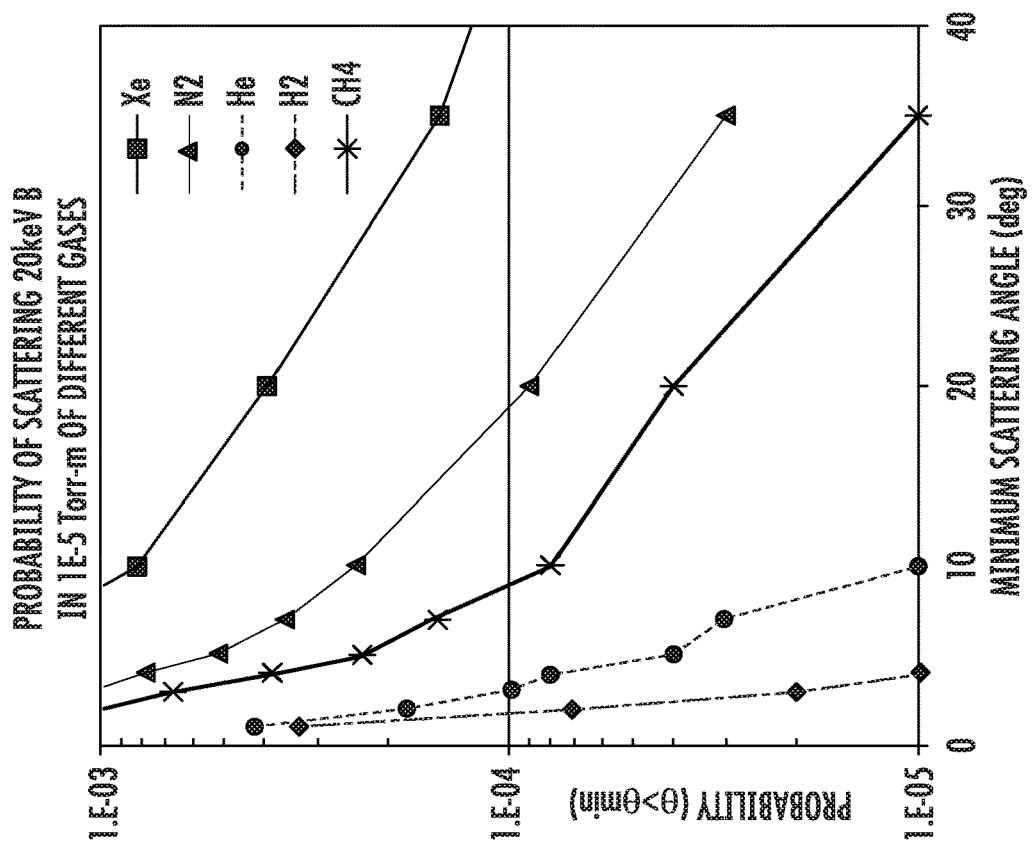
FIG. 3 illustrates the probability of scattering a 20 keV boron species for several different gases, as a function of scattering angle.

Moreover, the use of hydrogen gas 210 in the deceleration stage 116 greatly reduces the probability of scattering type collisions taking place, as opposed to nitrogen gas, for example. Notably, to provide optimal beam transport for an ion beam, especially at beam energies of less than 50 keV, for example, a gas pressure of approximately $5\times10^{-6}$ Torr, $1\times10^{-5}$ Torr or $3\times10^{-5}$ Torr may be used to provide sufficient ionizing events to reduce space charge in the ion beam, while not introducing excessive overall pressure in the beamline. At this pressure range, the probability of gas phase collision may be estimated for a given species in an ion beam. FIG. 3 illustrates the probability of scattering a 20 keV boron species for several different gases at a background gas pressure of $1\times10^{-5}$ Torr, as a function of scattering angle. As illustrated, at a scattering angle of approximately 4 degrees, the probability of scattering for hydrogen gas is nearly two orders of magnitude lower than for nitrogen gas, and the absolute value is $10^{-5}$, meaning that a given boron atom has just $10^{-5}$ chance of being scattered by a hydrogen gas species, even at a very low angle. These probabilities have been estimated using TRIM, a well-known Monte Carlo simulation program.

Referring again to FIG. 2, in some embodiments, the hydrogen source 118 may be coupled to a hydrogen port 119, to transport gas directly into the deceleration stage 116. In this manner, hydrogen may be provided directly in the environment needed where beam transport is optimized by providing an appropriate background gas pressure, while energy contamination is minimized by greatly reducing the probability of reflecting an energetic neutral through an exit of the deceleration stage.

In various additional embodiments, the hydrogen source providing hydrogen to a deceleration stage may be a local hydrogen source. Notably, in known ion implanters, hydrogen is not used for purposes of supplying a background gas. Among reasons for not using hydrogen in ion implanters are safety considerations such as flammability. In general, when using hazardous gases in known ion implanters to provide a source of implanting species, special gas boxes may be used to contain the hazardous gases, where these special gas boxes are placed in enclosures at high voltage to match the voltage of the ion source.

In one embodiment, to minimize safety issues, instead of a gas cylinder or gas tank, the local hydrogen source may be a source that generates hydrogen locally, and on demand. The local source supplying hydrogen need not be placed at a high potential of the ion source and activated during an implantation process. Accordingly, hydrogen gas is not present in the beamline of the ion implanter when hydrogen is not being used in the ion implanter. In a particular embodiment, an electrolytic hydrogen generator may be positioned in the proximity of a deceleration stage, to be operated to produce hydrogen gas for the deceleration stage during ion implantation when an ion beam is generated and directed through the deceleration stage.

Figure 4:
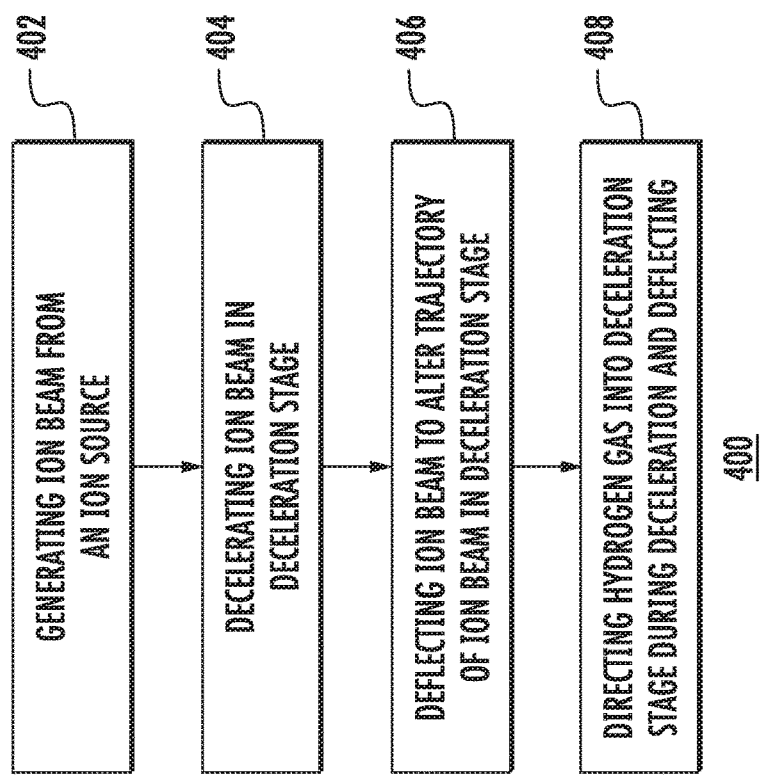
FIG. 4 depicts a process flow according to other embodiments of the disclosure.

FIG. 4 depicts a process flow 400 according to other embodiments of the disclosure. At block 402, an ion beam is generated at an ion source. In various embodiments, the ion source 102 may be an indirectly heated cathode (IHC) ion source, an RF ion source, a microwave ion source or other ion source. At block 404, the ion beam is decelerated in a deceleration stage. For example, the ion beam may be reduced in energy from 10 keV to 2 keV in one instance. At block 406, the ion beam is deflected to alter the trajectory of the ion beam in the deceleration stage. For example, the ion beam may be deflected from an initial trajectory entering the deceleration stage through an angle of 15 degrees, 30 degrees, 45 degrees or higher as the ion beam exits toward a substrate. At block 408, hydrogen gas is directed into the deceleration stage during the decelerating and deflecting of the ion beam. The hydrogen gas may establish a pressure of at least $5\times10^{-6}$ Torr in some embodiments. Accordingly, the hydrogen gas may provide optimum suppression of space charge effects in the ion beam, while not scattering energetic neutrals entering into the deceleration stage, avoiding the deflection of energetic neutrals toward the substrate.

There are multiple advantages provided by the present embodiments. A first advantage involves the ability to reduce the energy contamination in medium energy and low energy ion implanters without redesign of the accelerator columns. The present embodiments provide the additional advantage of a convenient and safe manner to reduce energy contamination from energetic neutrals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An ion implantation system, comprising:
an ion source to generate an ion beam;
a substrate stage disposed downstream of the ion source;
a deceleration stage including a component to deflect the ion beam, the deceleration stage disposed between the ion source and substrate stage; and
a gas source, the gas source coupled directly to the deceleration stage to provide hydrogen gas or helium gas to the deceleration stage,
wherein energetic neutrals generated from the ion beam are not scattered to the substrate stage.

2. The ion implantation system of claim 1, wherein the deceleration stage comprises a curved shape, wherein the deceleration stage does not provide a line of sight path for the ion beam from an entrance to an exit of the deceleration stage.

3. The ion implantation system of claim 1, comprising a port to transport the hydrogen gas or the helium gas directly into the deceleration stage.

4. The ion implantation of claim 1, the deceleration stage comprising a partial pressure of hydrogen or helium of at least $5\times10^{-6}$ Torr.

5. The ion implantation system of claim 1, the gas source comprising a plurality of ports to provide hydrogen gas or helium gas to the ion beam, wherein at least one port of the plurality of ports is disposed in the deceleration stage.

6. The ion implantation system of claim 1, the gas source comprising a local hydrogen generator.

7. The ion implantation system of claim 6, the gas source comprising an electrolytic hydrogen generator.

8. The ion implantation system of claim 1, wherein the ion beam comprises boron ions having an ion energy of 50 keV or less.

9. A method of ion implantation, comprising:
generating an ion beam;
decelerating the ion beam in a deceleration stage;
altering a trajectory of the ion beam during the decelerating; and
directing hydrogen gas or helium gas from a gas source directly into the deceleration stage during the decelerating.

10. The method of claim 9, wherein the hydrogen gas or helium gas is directed through a port in the deceleration stage.

11. The method of claim 9, wherein a gas pressure in the deceleration stage is at least $5\times10^{-6}$ Torr.

12. The method of claim 9, comprising generating the hydrogen gas using a local hydrogen generator.

13. The method of claim 12, the local hydrogen generator comprising an electrolytic hydrogen generator.

14. An ion implantation system, comprising:
a beamline, the beamline comprising:
an ion source to generate an ion beam, the ion beam comprising an implant species;
a substrate stage disposed downstream of the ion source;
a deceleration stage, the deceleration stage disposed between the ion source and substrate stage; and
a gas source, the gas source coupled directly to the deceleration stage to provide hydrogen gas to the beamline at a designed partial pressure,
wherein the implant species is scattered at an angle of no more than 5 degrees during collisions with the hydrogen gas.

15. The ion implantation system of claim 14, comprising a port to transport the hydrogen gas directly into the deceleration stage.

16. A method of ion implantation, comprising:
generating an ion beam, the ion beam comprising an implant species;
conducting the ion beam along a beamline using a plurality of beamline components;
decelerating the ion beam in a deceleration stage; and
directing hydrogen gas directly to the deceleration stage at a designed partial pressure,
wherein the implant species is scattered at an angle of no more than 5 degrees during collisions with the hydrogen gas.

* * * * *